United States Patent [19]

Malik

[11] 4,410,902
[45] Oct. 18, 1983

[54] PLANAR DOPED BARRIER SEMICONDUCTOR DEVICE

[75] Inventor: Roger J. Malik, Ithaca, N.Y.

[73] Assignee: The United States of America as represented by the Secretary of the Army, Washington, D.C.

[21] Appl. No.: 246,787

[22] Filed: Mar. 23, 1981

[51] Int. Cl.³ .................. H01L 29/06; H01L 29/36; H01L 29/90
[52] U.S. Cl. .............................. 357/13; 357/4; 357/33; 357/58; 357/89
[58] Field of Search ............... 357/13, 33, 58, 4, 89, 357/90

[56] References Cited

U.S. PATENT DOCUMENTS

| | | |
|---|---|---|
| 3,904,449 | 9/1975 | Di Lorenzo et al. ............ 357/13 |
| 3,940,783 | 2/1976 | Polata ............................... 357/13 |
| 3,984,858 | 10/1976 | Cornu et al. ..................... 357/58 |
| 4,149,179 | 4/1979 | Shannon .......................... 357/15 |
| 4,278,986 | 7/1981 | Mader .............................. 357/13 |
| 4,353,081 | 10/1982 | Allyn et al. ...................... 357/16 |

OTHER PUBLICATIONS

Malik et al., "Planar-Doped Barriers in GaAs . . . ", Electronics Letters, vol. 16, No. 22, Oct. 23, 1980, pp. 836-838.

Malik et al., IEEE Int. Electron Device Meeting, Tech. Digest, (Dec. 7, 1980) pp. 456-459.

Primary Examiner—William D. Larkins
Attorney, Agent, or Firm—Robert P. Gibson; Jeremiah G. Murray; Sheldon Kanars

[57] ABSTRACT

Disclosed is a majority carrier rectifying barrier semiconductor device housing a planar doped barrier. The device is fabricated in GaAs by an epitaxial growth process which results in an $n^+$-i-$p^+$-i-$n^+$ semiconductor structure wherein an extremely narrow $p^+$ planar doped region is positioned in adjoining regions of nominally undoped (intrinsic) semiconductive material. The narrow widths of the undoped regions and the high densities of the ionized impurities within the space charge region results in rectangular and triangular electric fields and potential barriers, respectively. Independent and continuous control of the barrier height and the asymmetry of the current vs. voltage characteristic is provided through variation of the acceptor charge density and the undoped region widths. Additionally, the capacitance of the device is substantially constant with respect to bias voltage.

14 Claims, 16 Drawing Figures

LEGEND
DEVICE A: $d_1 = 500\text{Å}$  $d_2 = 2000\text{Å}$  $N_p = 1\times10^{12}\text{cm}^{-2}$
DEVICE B: $d_1 = 250\text{Å}$  $d_2 = 2000\text{Å}$  $N_p = 2\times10^{12}\text{cm}^{-2}$

——————— CURRENT (MEASURED)
—·—·—·— CURRENT (THEORETICAL)
--------- CAPACITANCE

PLANAR DOPED BARRIER SEMICONDUCTOR DEVICE

The invention described herein may be manufactured used and licensed by or for the Government for governmental purposes without the payment to me of any royalties thereon.

BACKGROUND OF THE INVENTION

This invention relates to semiconductor devices and more particularly to majority carrier rectifying barrier devices.

Schottky barriers, p-n junctions and lattice matched heterojunctions are the three basic types of rectifying structures whose potential barrier heights are fixed by interface states and electron affinity and bandgap differences which impose restrictions in their utilization for electronic devices. In addition, majority carrier devices are necessary where speed requirements prohibit minority carrier current transport.

Although Schottky barriers are used almost exclusively for very high frequency switching, mixing and rectifying applications they exhibit several inherent limitations. For example, for a particular metal-semiconductor system, barrier heights are virtually constant and operational stability is related to metallurgy of the contact system. Interface states and interfacial layers play a dominant role in determining the Schottky barrier transport properties which can lead to undesirable hysteresis effects particularly in metal-GaAs structures. Attempts have been made in the past to modify the heights of Schottky barriers by implanting n and p type regions near the semiconductive surface and more recently rectification has been observed in a structure using implanted n+ and p+ regions in lightly doped n type silicon. Also known is a unipolar rectifying structure having a triangular potential barrier which has been induced by a graded layer of $Al_xGa_{1-x}As$.

In signal mixer applications for operation in the near millimeter wave frequency band, Schottky barrier devices typically used exhibits relatively large barrier heights which necessitates the use of relatively high local oscillator power. On the other hand, point contact devices exhibiting relatively low barrier heights require a delicate and time consuming formation process providing a relatively low yield during fabrication accompanied by erratic reproducability.

Accordingly, it is an object of the present invention to provide an improvement in semiconductive devices having a rectifying barrier.

Another object of the present invention is to provide a semiconductor barrier device having a relatively low barrier height.

Still another object of the present invention is to provide a semiconductor barrier device whose barrier height is variable.

And yet another object of the present invention is to provide a semiconductor device having a rectifying barrier whose characteristics can be continuously and independently controlled.

SUMMARY

Briefly, these and other objects are accomplished by means of a planar doped barrier semiconductor structure having a n+-i-p+-i-n+ configuration wherein there is a narrow plane of acceptor atoms positioned between a pair of nominally undoped regions bounded by two heavily doped donor regions. By varying the acceptor charge density and the undoped region widths, independent and continuous control of the barrier height and the asymmetry of its current-voltage characteristics is provided.

DESCRIPTION OF THE PREFERRED EMBODIMENT

Molecular beam epitaxy (MBE) is a known but relatively new semiconductor growth technique which involves the use of selected molecular beams for condensation on a heated substrate in an ultra-high vacuum environment. This process has been disclosed, for example, in a publication entitled, "Structures Grown By Molecular Beam Epitaxy", L. L. Chang, et al., J. Vac. Sci. Technol., Vol. 10, No. 5, September/October, 1973, page 655 and is herein incorporated by reference. Due to the relatively slow growth rate and low substrate temperature, very precise epilayer thicknesses and abrupt doping profiles can be obtained.

The present invention is directed to a semiconductor structure preferably fabricated by MBE techniques and concerns the deposition of n type and p type dopant atoms during MBE growth such that a precise density of dopant atoms is incorporated in extremely thin layers or planes of semiconductor material ranging from a single atomic plane to several hundred angstroms (Å). Moreover, the present invention is directed to a rectifying majority carrier structure having a planar doped barrier formed by selected highly doped thin layers of dopant atoms appropriately placed within a semiconductor body. When desirable, however, the structure may be fabricated by chemical vapor deposition (CVD), a process also well known to those skilled in the art.

Figure 1:
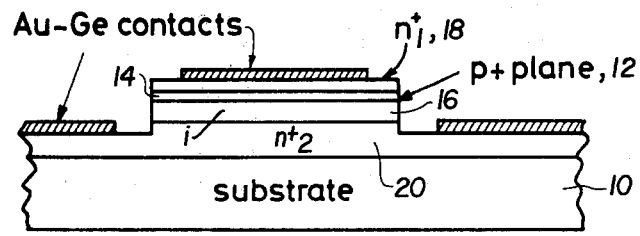
FIG. 1 is a partial cross sectional view of a semiconductor structure embodying the subject invention.
Figures 3, 4:
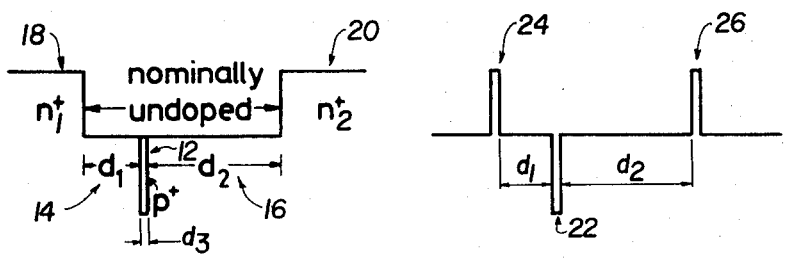
FIG. 3 is a diagram illustrative of the doping profile of the embodiment of the invention shown in FIGS. 1 and 2.
FIG. 4 is a diagram illustrative of the space charge density of the embodiment shown in FIGS. 1 and 2.
Figure 2:
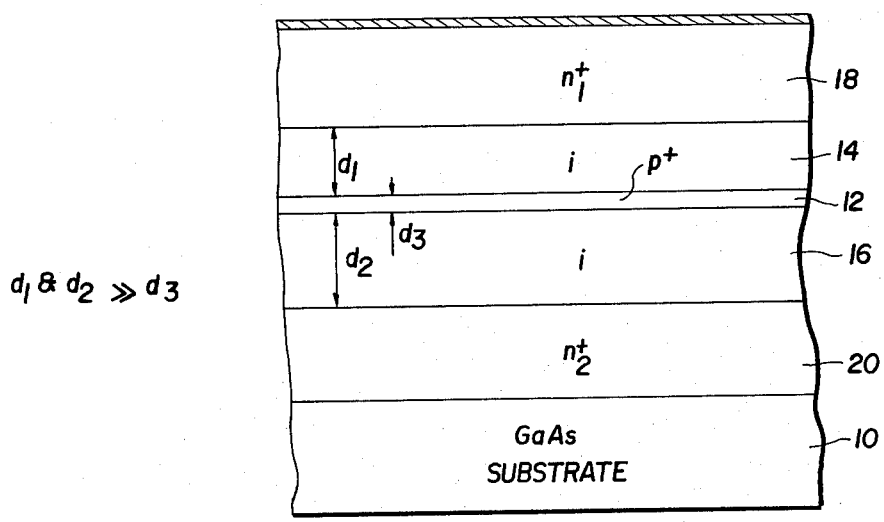
FIG. 2 is an enlarged cross sectional view of the structure shown in FIG. 1.

Referring now to the figures, and more particularly to FIGS. 1 and 2 collectively, reference numeral 10 denotes a substrate consisting of a Group III-V compound, preferably gallium arsenide (GaAs) on which is formed a n+-i-p+-i-n+ layered structure consisting of a relatively narrow highly doped p+ planar region 12 located within intrinsic or nominally undoped regions consisting of upper and lower contiguous i planar regions 14 and 16 bordered respectively by highly doped n+ surface and buffer planar regions 18 and 20. As shown in FIG. 2, the thickness of the intrinsic regions 14 and 16 is denoted by $d_1$ and $d_2$, respectively, with the thickness of the p+ region 12 being designated by $d_3$. The undoped regions consisting of the intermediate i layers 14 and 16 have a total number of impurities which is small when compared to the p+ plane 12 so that the doping impurity profile for the structure in FIG. 2 for the layers 12, 14 . . . 20 is as shown in FIG. 3. The relatively narrow p+ planar region 12 accordingly defines an acceptor region while the heavily doped n+ layers 18 and 20 constitute a pair of donor regions.

The p+ plane 12 constitutes a region which, within certain constraints, is fully depleted and at zero bias relatively narrow space charge regions will be induced in the two n+ layers 18 and 20 in order to satisfy the condition for charge neutrality and establish an equilibrium Fermi level. The proportions of the space charge in the regions defined by the layers 18 and 20 will depend upon the position of the p+ plane 12 within the undoped region defined by the intrinsic layers 14 and 16. The charge profile is illustrated in FIG. 4 whereupon reference numeral 22 denotes a depleted space charge region of the p+ plane 12 while reference numerals 24 and 26 denote the narrow space charge regions induced in the n+ layers 18 and 20. For doping levels in the order of $1 \times 10^{18}$ atoms/cm$^3$ space charge regions of 100 Å are typical for the regions 22, 24 and 26; however, in principle, they can be reduced to a single atomic plane. In the present invention the space charge regions 22, 24 and 26 are separated by much larger distances such that $d_1$ and $d_2$ respectively vary, for example, from several hundred (200 Å) to several thousand angstroms (2000 Å), depending on the current vs. voltage (I-V) characteristic desired.

Figure 5:
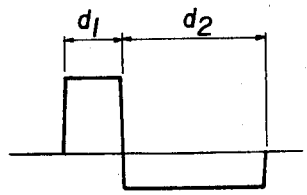
FIG. 5 is a diagram illustrative of the electric field distribution in the embodiment shown in FIGS. 1 and 2.
Figure 6:
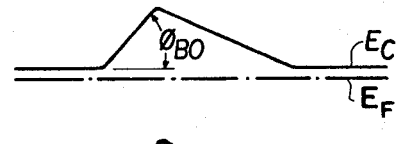
FIG. 6 is an energy band diagram of the embodiment shown in FIGS. 1 and 2.

A solution of Poisson's equation, a well known expression for deriving barrier heights, yields electric field and energy-band diagrams as shown in FIGS. 5 and 6, respectively. In the limit as space charge widths 22, 24 and 26 approach single atomic planes and the undoped regions 14 and 16 become truly intrinsic, the electric field and band-energy profiles, respectively, become exactly rectangular and triangular in shape.

In operation, majority carrier thermionic transport occurs across the planar doped barrier defined by the layers 12, 14 and 16 with the application of a bias voltage across layers 18 and 20. Minority carrier effects will be suppressed as long as the p+ planar region 12 is always depleted of holes. This implies that the maximum built in potential barrier $\phi_{max}$ must be slightly less than the bandgap existing between the conductive band edge $E_c$ and the valence band edge $E_v$ of the semiconductor as shown in FIG. 6. For zero bias, the expression of built in potential $\phi_{BO}$ can be stated as:

$$\phi_{BO} = \frac{Q_p}{\epsilon_s} \left( \frac{d_1 d_2}{d_1 + d_2} \right) \quad (1)$$

where $\epsilon_s$ is the permativity of the semiconductor, $Q_p$ is the space charge density in the p+ planar region 12, and $d_1$ and $d_2$ are the respective distances separating the p+ plane 12 from the upper n+ region 18 and the lower buffer n+ region 20. It is evident that $\phi$ can be varied from 0 to approximately the bandgap of the semiconductor through appropriate choice of $Q_p$, $d_1$ and $d_2$.

Figure 7:
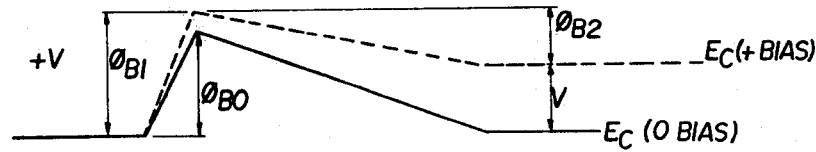
FIGS. 7 and 8 are diagrams generally illustrative of the variable barrier height characteristic provided by the subject invention.
Figure 8:
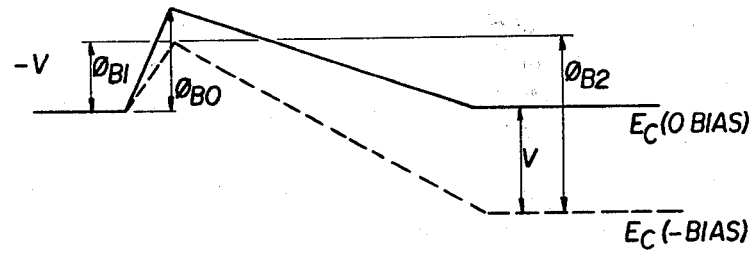

Referring now to FIGS. 7 and 8, shown therein are illustrative conductive band edge $E_c$ diagrams showing the response of the barrier heights as expressed in terms of $\phi$ in the subject invention for positive and negative bias potentials $+V$ and $-V$. Under a positive bias $(+V)$ the n+ layer 18 is positive and assuring the p+ plane 12 is much closer to the n+ layer 18 than the layer 20, meaning that $d_2$ is greater than $d_1$, as shown in FIG. 2, the potential $\phi_{B1}$ increases slightly over the value $\phi_{BO}$ while $\phi_{B2}$ is reduced by an amount nearly equal to the bias voltage B as illustrated in FIG. 7. Forward current occurs by emmission of electrons from the n+ layer 20 over the barrier formed by the layers 12, 14 and 16 into the n+ layer 18. Under a negative bias as indicated by FIG. 8, $\phi_{B1}$ is reduced with respect to the value $\phi_{BO}$ while $\phi_{B2}$ increases by an amount almost equal to the applied bias voltage V. Significant reverse current flow therefore occurs at a much higher voltage; however, emission of electrons occurs from the n+ layer 18 in the reverse direction over the barrier into the n+ layer 20.

Mathematically the barrier height $\phi_{B1}$ near the surface of n+ layer 18 can be expressed as:

$$\phi_{B1} = \phi_{BO} + \frac{d_1}{(d_1 + d_2)} V \quad (2)$$

In the same way the barrier height $\phi_{B2}$ near the substrate, i.e. n+ layer 20 has a barrier height which can be expressed as:

$$\phi_{B2} = \phi_{BO} - \frac{d_2}{(d_1 + d_2)} V \quad (3)$$

Figure 9A:
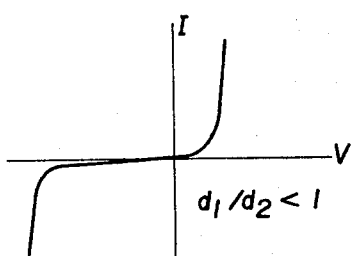
FIGS. 9A-9D are a set of graphs illustrative of the variable current voltage characteristic provided by the subject invention.
Figure 9B:
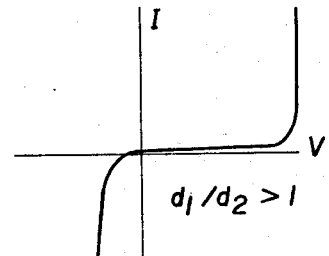
Figure 9C:
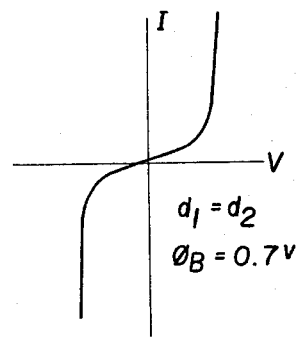
Figure 9D:
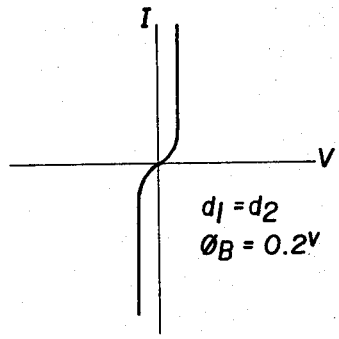

From the equation (1) the zero barrier height $\phi_{BO}$ can be continuously variable and can be designed for a particular device application through appropriate choices of $Q_p$, $d_1$ and $d_2$. It is also evident from equations (2) and (3) that under bias one barrier $\phi_{B1}$ or $\phi_{B2}$ increases while the other decreases and the relative change in $\phi$ is controlled by $d_1$ and $d_2$. Thus the choice of $d_1$ and $d_2$ influences the symmetry of the current-voltage (I-V) characteristic while the selection of all three parameters determines the actual I-V characteristic exhibited. Accordingly, an asymmetric I-V curve is obtained when the values of $d_1$ and $d_2$ are not equal as shown in FIGS. 9A and 9B whereas asymmetrical I-V curve is obtained when $d_1$ and $d_2$ are equivalent as shown in FIGS. 9C and 9D.

Figure 10:
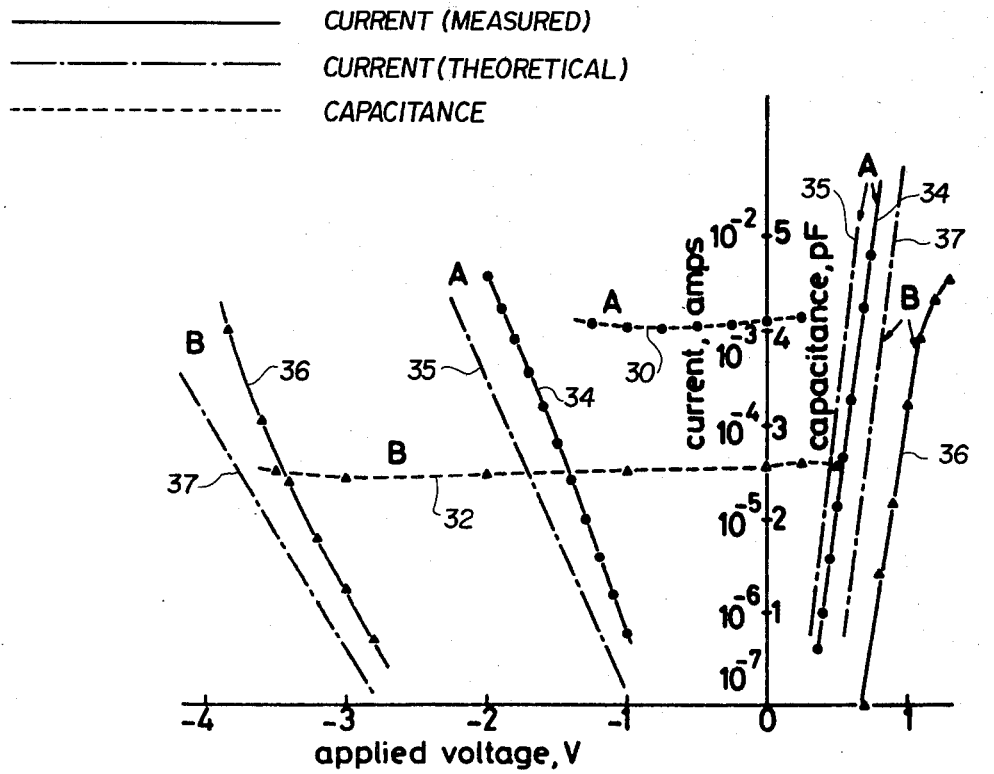
FIG. 10 is a set of curves illustrative of the relationship between theoretical and measured parameters for two devices in accordance with the subject invention.

Referring now to FIG. 10, shown therein is a composite graph of logarithmic current vs. voltage and capacitance vs. voltage curves obtained from measurements on two typical planar doped devices in accordance with the subject invention wherein device A, for example, has typical values for $d_1$ and $d_2$ of 500 Å and 2000 Å, respectively, and $N_p = Q_p/\epsilon_s$ is in the order of $1 \times 10^{12}$ cm$^{-2}$. The device B, on the other hand, has $d_1$ and $d_2$ values of 250 Å and 2000 Å, respectively, an $N_p$ value in the order of $2 \times 10^{12}$ cm$^{-2}$. The substantially flat C-V curves 30 and 32 demonstrate that the capacitance is virtually constant with respect to bias voltage whereas the curves 34 and 36 indicate that the relative turn-on voltages for positive and negative bias are dependent upon the ratio of $d_1/d_2$. The theoretical current curves 35 and 37 associated with curves 34 and 36 are offset therefrom due to the finite widths of the ionized acceptor region 12 and donor regions 18 and 20 and the charge contained in the undoped regions 14 and 16. In general, the agreement between the theoretical curves and experimental curves tend to close when the distances $d_1$ and $d_2$ are much greater than the ionized impurity widths and the area acceptor charge density is much greater than the area of charge density in the undoped regions.

Figure 11A:
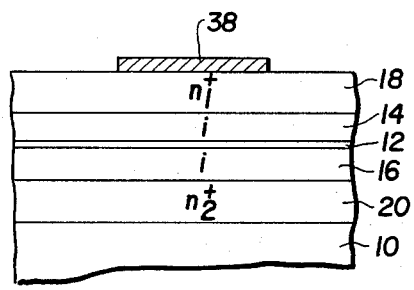
FIGS. 11A-11C are diagrams illustrative of the fabrication of ohmic contacts in a device in accordance with the subject invention.
Figure 11B:
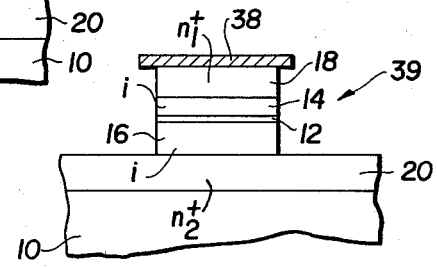
Figure 11C:
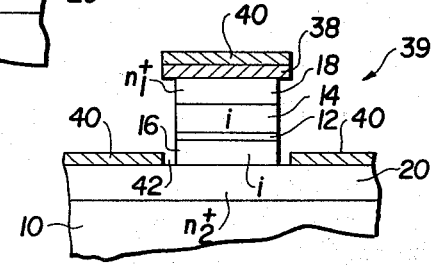

FIGS. 11A through 11C are intended to illustrate a epilayer structure according to the invention described above fabricated in the form of a diode wherein a first ohmic contact layer 38 is formed on the top of the n+ planar region or layer 18 with a subsequent etching of the upper layers as shown in FIG. 11B leaving a small circular mesa 39 beneath the ohmic contact 38. Following this, a gold/germanium contact layer 40 is evaporated onto the structure leaving a small spacing 42 around the mesa. Such fabrication techniques are well known and provide for a self-aligned metallization type of device which can be utilized to help minimize the series resistance of the device.

The planar doped structure of the subject invention as noted above is fabricated in accordance with an MBE process grown preferably on gallium arsenide. With respect to the n and p type dopant materials utilized, germanium and beryllium respectively comprise the preferred dopant materials. Moreover, a planar doped structure in accordance with the subject invention has particular utility in signal mixers operated in near millimeter wave frequencies and can be used to replace Schottky barrier devices which exhibit relatively large barrier heights. Moreover, the relatively low forward barrier height provided by a single planar doped diode structure can be used in the balanced mixer application to replace two conventional precisely matched diodes and can be used in unpackaged chip form allowing for a relatively simple design and implementation in microstrip and stripline circuits.

While the subject invention has been described with a certain degree of particularity, the foregoing has been made by way of illustration and not of limitation. Accordingly, all modifications, alterations and changes coming within the spirit and scope of the invention as set forth in the appended claims are herein meant to be included.

I claim:

1. A semiconductor rectifying device having a planar doped barrier comprising, in combination:
    a relatively thin planar region of semiconductor material doped with a first type dopant material to provide an acceptor region;
    first and second relatively thick planar regions of substantially undoped semiconductor material respectively formed on opposite sides of said thin planar region;
    a pair of outer planar regions of semiconductor material doped with a second type dopant material respectively formed on said first and second planar regions to provide a pair of donor regions;
    a semiconductor substrate in contact with one of said outer pair of planar regions; and
    an ohmic contact region formed on the other of said pair of outer planar regions;
    said relatively thin planar acceptor region becoming, in absence of a bias potential being applied thereto, substantially depleted in order to establish an equilibrium Fermi level whereupon charge regions are induced in said pair of outer planar donor regions, said device further being adapted to exhibit thermionic transport with the application of positive and negative bias potentials thereto to provide a desired barrier height and a variable current voltage characteristic.

2. The device as defined by claim 1 wherein said device is formed from a group III-V compound by an epitaxial growth process.

3. The device as defined in claim 2 wherein said epitaxial growth process includes the process of molecular beam epitaxy and chemical vapor deposition.

4. The device as defined by claim 1 wherein said device is formed from a group of semiconductor compounds which includes gallium arsenide.

5. The device as defined by claim 1 wherein said first type of dopant material comprises p type dopant material and wherein said second type dopant material comprises n type dopant material.

6. The device as defined by claim 5 wherein said p and n type dopants consist of p+ and n+ type dopant material.

7. The device as defined by claim 6 wherein said p+ type dopant material comprises beryllium.

8. The device as defined by claim 6 wherein said n+ type dopant material comprises germanium.

9. The device as defined by claim 1 wherein said relatively thin planar acceptor region has a thickness ranging from a single atomic plane to substantially one hundred angstroms and wherein said first and second relatively thick undoped planar regions have respective thicknesses ranging between at least one hundred angstroms and several thousand angstroms.

10. The device as defined by claim 1 wherein said first and second undoped planar regions have respective thicknesses ranging between substantially 200 Å and 2000 Å.

11. The device as defined by claim 1 wherein said first and second undoped planar regions have mutually unequal thicknesses to provide an asymmetrical current vs. voltage characteristic.

12. The device as defined by claim 1 wherein said first undoped planar region is relatively thinner than the said second undoped planar region and wherein said first planar region is located on the ohmic contact side of said relatively thin planar region and said second relatively thicker planar region lies on the substrate side of said thin planar region.

13. The device as defined by claim 1 wherein said first and second undoped planar regions are of substantially the same thickness for providing a substantially symmetrical current vs. voltage characteristic.

14. A semiconductor rectifying device having a planar doped barrier comprising, in combination:
    a relatively thin planar region of semiconductor material doped with a first type dopant material to provide a charged region of a first polarity;
    first and second relatively thick planar regions of substantially undoped semiconductor material respectively formed on opposite sides of said thin planar region;
    a pair of outer planar regions of semiconductor material doped with a second type dopant material respectively formed on said first and second planar regions to provide a pair of charged regions having a common polarity opposite of said first polarity;

a semiconductor substrate in contact with one of said outer pair of planar regions; and
an ohmic contract region formed on the other of said pair of outer planar regions;
said relatively thin planar region becoming, in absence of a bias potential being applied thereto, substantially depleted in order to establish an equilibrium Fermi level whereupon charge regions are induced in said pair of outer planar regions, said device further being adapted to exhibit thermionic transport with the application of positive and negative bias potentials thereto to provide a desired barrier height and a variable current voltage characteristic.

* * * * *